(12) United States Patent
Cheng et al.

(10) Patent No.: US 9,087,921 B2
(45) Date of Patent: Jul. 21, 2015

(54) CMOS WITH DUAL RAISED SOURCE AND DRAIN FOR NMOS AND PMOS

(71) Applicant: International Business Machines Corporation, Armonk, NY (US)

(72) Inventors: Kangguo Cheng, Schenectady, NY (US); Bruce B. Doris, Slingerlands, NY (US); Balasubramanian S. Haran, Albany, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/608,365

(22) Filed: Jan. 29, 2015

(65) Prior Publication Data

US 2015/0147853 A1    May 28, 2015

Related U.S. Application Data

(62) Division of application No. 13/179,990, filed on Jul. 11, 2011.

(51) Int. Cl.
*H01L 27/12* (2006.01)
*H01L 21/8238* (2006.01)

(52) U.S. Cl.
CPC *H01L 21/823864* (2013.01); *H01L 21/823814* (2013.01)

(58) Field of Classification Search
CPC ............... H01L 29/78618; H01L 29/7821
USPC ............................................. 257/351
See application file for complete search history.

(56) References Cited

U.S. PATENT DOCUMENTS

| | | |
|---|---|---|
| 4,072,545 A | 2/1978 | De La Moneda |
| 5,079,180 A | 1/1992 | Rodder et al. |
| 6,346,447 B1 | 2/2002 | Rodder |
| 6,891,228 B2 | 5/2005 | Park et al. |
| 6,906,360 B2 | 6/2005 | Chen et al. |
| 7,018,891 B2 | 3/2006 | Doris et al. |
| 7,696,036 B2 | 4/2010 | Bu et al. |
| 7,855,105 B1 | 12/2010 | Jagannathan et al. |
| 8,030,708 B2 | 10/2011 | Tateshita |
| 8,084,309 B2 | 12/2011 | Cheng et al. |
| 8,338,260 B2 | 12/2012 | Cheng et al. |
| 2003/0219971 A1 | 11/2003 | Cabral, Jr. et al. |
| 2005/0048752 A1* | 3/2005 | Doris et al. ............... 438/595 |
| 2005/0051851 A1 | 3/2005 | Chen et al. |
| 2005/0164433 A1 | 7/2005 | Doris et al. |
| 2006/0128111 A1 | 6/2006 | Beintner et al. |
| 2006/0157797 A1 | 7/2006 | Tateshita |

(Continued)

*Primary Examiner* — Mohammad Islam
*Assistant Examiner* — Ankush Singal
(74) *Attorney, Agent, or Firm* — Cantor Colburn LLP

(57) ABSTRACT

An apparatus and a method for creating a CMOS with a dual raised source and drain for NMOS and PMOS. The spacers on both stack gates are of equal thickness. In this method, a first insulating layer is formed on the surface. The first region is then masked while the other region has the first layer etched away and has an epitaxial source and drain grown on the region. A second layer is formed to all exposed surfaces. The second region is then masked while the first region is etched away. The epitaxial source and drain is formed on the first region. The second region can also be masked by adding a thin layer of undoped silicon and then oxidize it. Another way to mask the second region is to use a hard mask. Another way to form the second source and drain is to use amorphous material.

6 Claims, 11 Drawing Sheets

(56) References Cited

U.S. PATENT DOCUMENTS

| | | |
|---|---|---|
| 2006/0172468 A1 | 8/2006 | Orlowski |
| 2007/0020866 A1 | 1/2007 | Cheng |
| 2007/0045729 A1 | 3/2007 | Hoentschel et al. |
| 2007/0138570 A1 | 6/2007 | Chong et al. |
| 2007/0194387 A1 | 8/2007 | Dyer et al. |
| 2007/0267753 A1 | 11/2007 | Luo et al. |
| 2008/0102573 A1 | 5/2008 | Liang et al. |
| 2008/0179636 A1 | 7/2008 | Chidambarrao et al. |
| 2008/0217686 A1 | 9/2008 | Majumdar et al. |
| 2009/0039426 A1 | 2/2009 | Cartier et al. |
| 2009/0289305 A1 | 11/2009 | Majumdar et al. |
| 2009/0311836 A1 | 12/2009 | Cartier et al. |
| 2010/0176426 A1 | 7/2010 | Meunier-Bellard et al. |
| 2010/0200919 A1 | 8/2010 | Kikuchi |
| 2011/0037125 A1 | 2/2011 | Cheng et al. |
| 2011/0042744 A1 | 2/2011 | Cheng et al. |
| 2011/0049630 A1 | 3/2011 | Majumdar et al. |
| 2011/0108943 A1 | 5/2011 | Dennard et al. |
| 2011/0175164 A1 | 7/2011 | Bedell et al. |
| 2011/0198675 A1 | 8/2011 | Ng et al. |
| 2011/0227157 A1 | 9/2011 | Yang et al. |
| 2011/0233688 A1 | 9/2011 | Ren et al. |
| 2011/0254090 A1 | 10/2011 | Cheng et al. |
| 2011/0309446 A1 | 12/2011 | Doris et al. |
| 2012/0018813 A1 | 1/2012 | Holmes et al. |
| 2012/0049284 A1 | 3/2012 | Doris et al. |
| 2012/0061759 A1 | 3/2012 | Cheng et al. |
| 2012/0153393 A1 | 6/2012 | Liang et al. |
| 2012/0286364 A1 | 11/2012 | Cheng et al. |
| 2012/0313168 A1 | 12/2012 | Cheng et al. |
| 2013/0005095 A1 | 1/2013 | Cai et al. |

\* cited by examiner

CMOS WITH DUAL RAISED SOURCE AND DRAIN FOR NMOS AND PMOS

This application is a divisional of U.S. patent application Ser. No. 13/179,990, filed Jul. 11, 2011, the disclosure of which is incorporated by reference herein in its entirety.

BACKGROUND

The present invention relates generally to Complementary Metal Oxide Semiconductor (CMOS) devices and, more particularly, to CMOS integration on extremely thin silicon on insulator (ETSOI) with dual raised source and drain on both nFET and pFET.

CMOS technology is employed in almost every electronic circuit application. One type of CMOS technology employs Silicon-On-Insulator (SOI) substrates in place of conventional silicon. The benefit of SOI over conventional silicon is the reduced parasitic capacitance that leads to improved performance. The implementation of SOI technology has allowed for the continued scaling planar silicon technology.

Extremely Thin Silicon-On-Insulator (ETSOI) is a leading candidate for further continued scaling of planar silicon technology. However, the successful introduction of ETSOI in manufacturing requires integration of negative-type field effect transistors (nFET) and positive-type field effect transistors (pFET) with high performance and low leakage.

A key feature to improve performance and reduce series resistance in ETSOI is the use of raised source/drain (RSD) epitaxy. In RSD epitaxy, the source and drain regions are formed above the channel region to obtain low series resistance. Formation of RSD requires the use of spacers. Current approaches to RSD integration on ETSOI planar devices rely on differential spacer thickness on the nFET and the pFET.

A drawback of the nFET and the pFET having differential spacer thickness is that it increases the scale of the device. It is desirable to have to have the same spacer thickness on both the nFET and the pFET. There is a need for an improved CMOS device and method of manufacturing the same.

SUMMARY

In consideration of the foregoing, the present invention provides methods and an apparatus for creating a Complementary Metal Oxide Semiconductor (CMOS) structure with two Raised Source Drain (RSD) structures, wherein the spacers have an equal thickness.

In one aspect of the invention, the method for creating a dual RSD CMOS with equal spacer thickness includes providing a silicon-on-insulator substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the insulating layer in the second region to form insulating spacers on sidewalls of the second gate stack, forming epitaxial source and drain layers on the second substrate surface, forming a second insulating layer on all exposed surfaces in the first and second regions, removing the second insulating layer in the first region to expose the first insulating layer, etching the first insulting layer in order to form insulating spacers on sidewalls of the first gate stack and expose the first substrate surface, forming undoped epitaxial source and drain layers on the first substrate surface, implanting a dopant into the source and drain layers on the first substrate surface, removing the second insulating layer in the second region, if the source and drain layers on the second substrate surface are undoped, implanting a dopant into the source and drain layers on the second substrate surface and forming silicide contacts on the source and drain layers in both the first and second regions and on the first and second gate stacks.

In another aspect, the method for creating a dual RSD CMOS with equal spacer thickness includes providing a silicon-on-insulator substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, forming epitaxial source and drain layers on the second substrate surface, forming a layer of undoped epitaxial silicon on the source and drain layers on the second substrate surface, oxidizing a top surface of the layer of undoped epitaxial silicon to form a hard mask layer, etching the first insulating layer in the first region to form insulating spacers on sidewalls of the first gate stack and to expose the first substrate surface, forming in-situ doped epitaxial source and drain layers on the first substrate surface, removing the oxidized layer of undoped epitaxial silicon on the source and drain layers on the second substrate, if the source and drain layers on the second substrate surface are undoped, implanting a dopant into the source and drain layers on the second substrate surface and forming silicide contacts on the source and drain layers in both the first and second regions and on the first and second gate stacks.

In yet another aspect, the method for creating a dual RSD CMOS with equal spacer thickness includes providing a silicon-on-insulator substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, forming epitaxial source and drain layers on the second substrate surface, forming a thin amorphous layer on the source and drain layers on the second substrate surface, etching the first insulating layer in the first region to form insulating spacers on sidewalls of the first gate stack and to expose the first substrate surface, forming in-situ doped epitaxial source and drain layers on the first substrate surface, removing the thin amorphous layer and any amorphous material that formed during the formation of the in-situ doped epitaxial source and drain layers and forming silicide contacts on the source and drain layers in both the first and second regions and on the first and second gate stacks.

In another aspect, the method for creating a dual RSD CMOS with equal spacer thickness includes providing a silicon-on-insulator substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, forming epitaxial source and drain layers on the second substrate surface, forming a hard mask layer on all exposed surfaces in the first and second regions, removing the hard mask layer in the first region to expose the first insulating layer, etching the first insulating layer in order to form insulating spacers on sidewalls of the first gate stack and expose the first substrate surface, forming epitaxial source and drain layers on the first substrate surface, removing the hard mask layer in the second region and forming silicide contacts on the source and drain layers in both the first and second regions and on the first and second gate stacks.

BRIEF DESCRIPTION OF THE SEVERAL VIEWS OF THE DRAWINGS

For a more complete understanding of the present invention and the advantage thereof, reference is now made to the following description taken in conjunction with the accompanying drawings.

DETAILED DESCRIPTION

Hereinafter, embodiments of the present invention will be described by referring to the accompanying drawings.

For all aspects, the "first region" and "second region" refer to FET regions of a CMOS device. The first region can be an nFET or a pFET and accordingly the second region is oppositely doped. Thus, if the first region is an nFET, the second region is a pFET or vice versa. Acceptable dopants for an nFET include, but are not limited to, phosphorus, arsenic, or both. An example dopant concentration includes from about $1E19$ atoms/cm$^3$ to about $8E21$ atoms/cm$^3$ and is preferably $5E20$ atoms/cm$^3$. Acceptable dopants of a pFET include, but are not limited to, boron and boron difluoride ($BF_2$). An example dopant concentration includes from about $1E19$ atoms/cm$^3$ to about $5E21$ atoms/cm$^3$ and is preferably $8E20$.

Figure 1A:
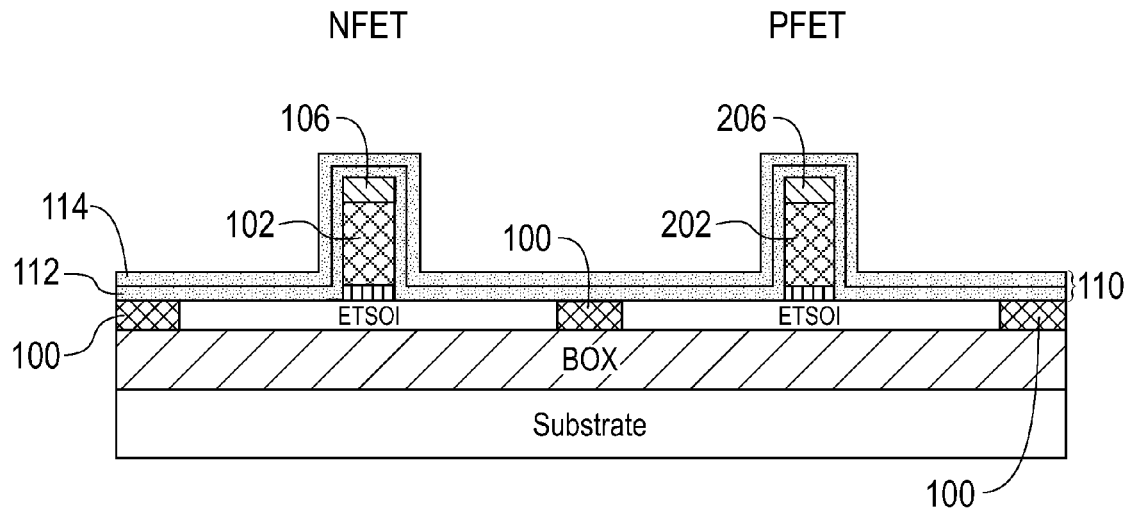
FIGS. 1A, 1B and 1C are a cross-sectional representation of the masking and etching of a CMOS structure to form the first spacer.

FIG. 1A shows a CMOS structure with two FET portions: one portion being a n-type field effect transistor (nFET) portion and a second portion being a p-type field effect transistor (pFET) portion. The nFET portion and the pFET portion are isolated by a shallow trench isolation (STI) (100). The nFET portion and pFET portion rest on top of a substrate layer. The substrate layer can be a semiconductor on insulator substrate (SOI).

In general, SOI substrates are made of three parts: a bottom bulk semiconductor layer, a buried oxide layer (BOX) and a semiconductor layer on top of the BOX. In this application, the semiconductor layer on top of the BOX is referred to as the "ETSOI" or "ETSOI layer". The SOI substrate as a whole (i.e. all three layers: SUBSTRATE, BOX and ETSOI are referred to as "SOT substrate". Note, with an SOT substrate, a top surface of the substrate is equivalent to the top surface of the ETSOI layer.

According to the present invention, the SOT substrate has a preferable thickness equal to or less than 120 nm. The nFET and pFET portion each have a gate stack (102, 202) and a gate nitride cap (106, 206) formed on top of the ETSOI surface. The gate stack may include an SiO2 containing interfacial layer of about 2-40 A with a preferred thickness of about 6 A. A high k layer made of hafnium oxide, hafnium silicate, hafnium silicon oxynitride layer, zirconium oxide etc. with thickness of range 10 A to 50 A with a preferred thickness of about 2 nm. The gate nitride cap may be from 1 nm thick to 50 nm thick and is preferably 30 nm thick.

Forming the First Raised Source Drain

In FIG. 1A, according to the proposed method, a first insulating layer (110) is deposited over the substrate. The first insulating layer is composed of a bottom silicon nitride (112) and a top furnace nitride (114). The silicon nitride film can be deposited by plasma enhanced chemical vapor deposition (PECVD), Rapid Thermal Chemical Vapor Deposition (RTCVD), or Low Pressure Chemical Vapor Deposition (LPCVD). The thickness of the silicon nitride layer is in the range of 1 to 50 nm with a preferred thickness of about 15 nm.

Figure 1B:
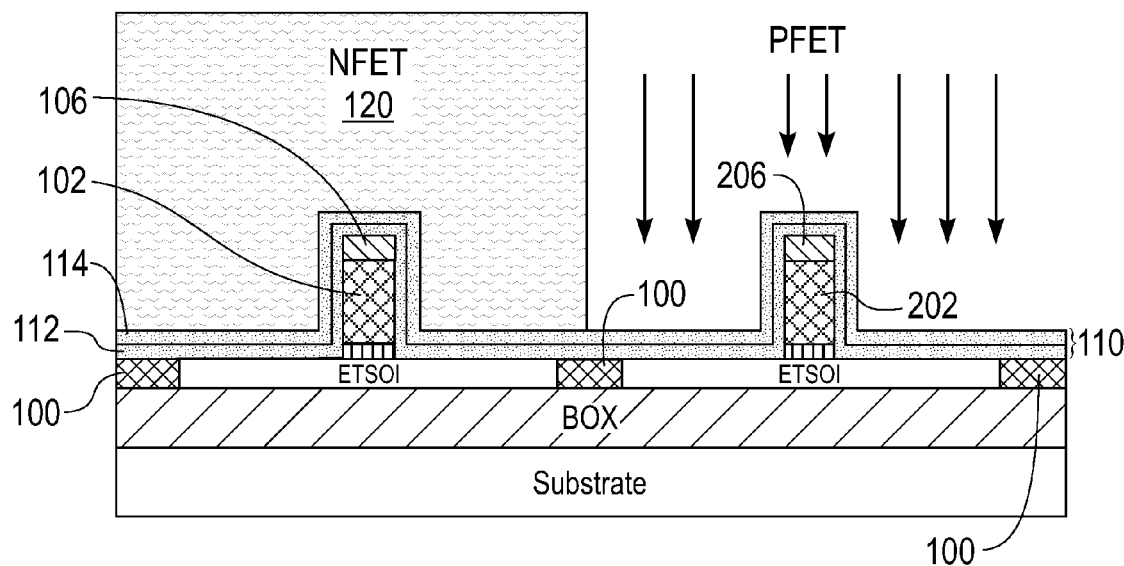

FIG. 1B illustrates the etching of the pFET region. After the first insulating layer (110) is formed, the nFET region is masked with a mask (120) using a lithography process. The first insulating layer (110) in the pFET region is etched away to form the sidewall spacers (208) on the sidewall of the pFET region.

Figure 1C:
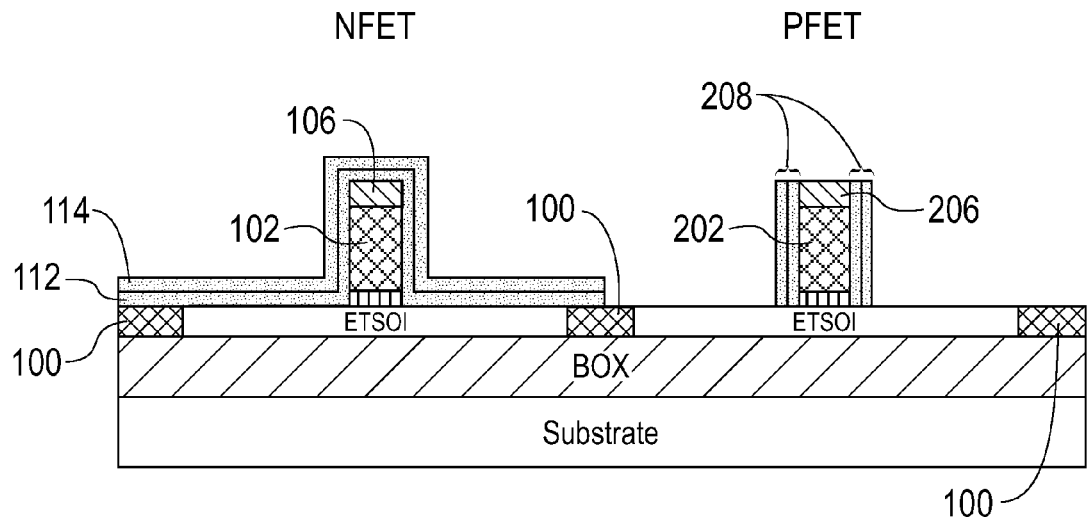

FIG. 1C illustrates the sidewall spacers (208). After the etching is done, the ETSOI surface in the pFET region is exposed and sidewall spacers (208) are on the side of the pFET gate stack. The sidewall spacers (208) are composed of a silicon nitride (112) and furnace nitride (114) on the side of the gate stack (202). The pFET sidewall spacer thickness of both the nitride layers is from about 6 nm to about 30 nm.

Figure 2:
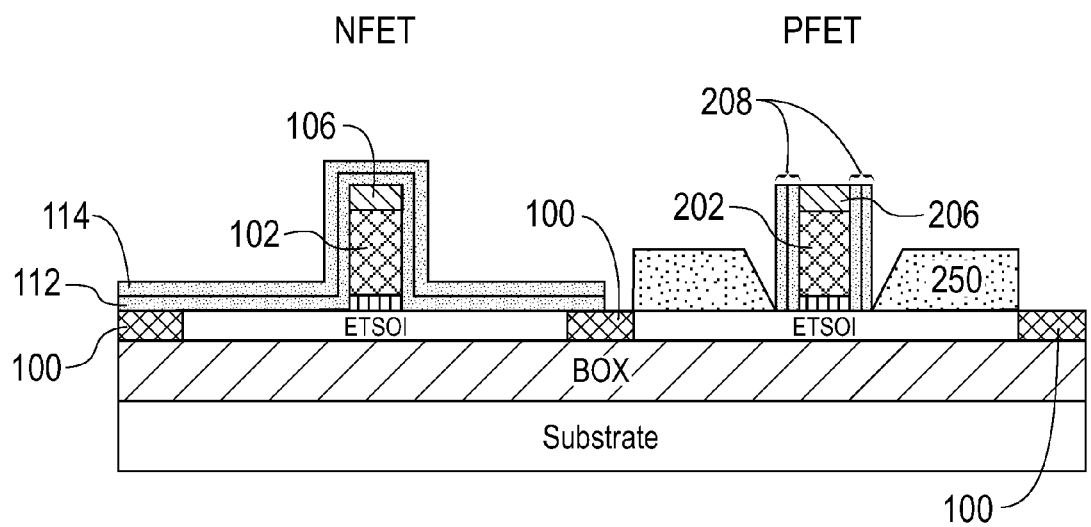
FIG. 2 is a cross-sectional representation of a RSD after epitaxy.

FIG. 2 illustrates the raised source drain (250) on the pFET region. The raised source drain (250) is then grown using in-situ doping on the ETSOI of the pFET region. Suitable raised source drain material for a pFET can be SiGe or Si and is preferably SiGe. Suitable raised soured drain material for an nFET can by Si or SiC. The thickness of the raised source drain is from about 5 nm to about 70 nm, preferably 35 nm. After the sidewall spacers are formed, the mask (120) from the nFET region is removed. A doped epitaxial growth is applied to the pFET region to form the first RSD (250).

Forming the Second Raised Source Drain Using a Second Insulating Layer

Figure 3A:
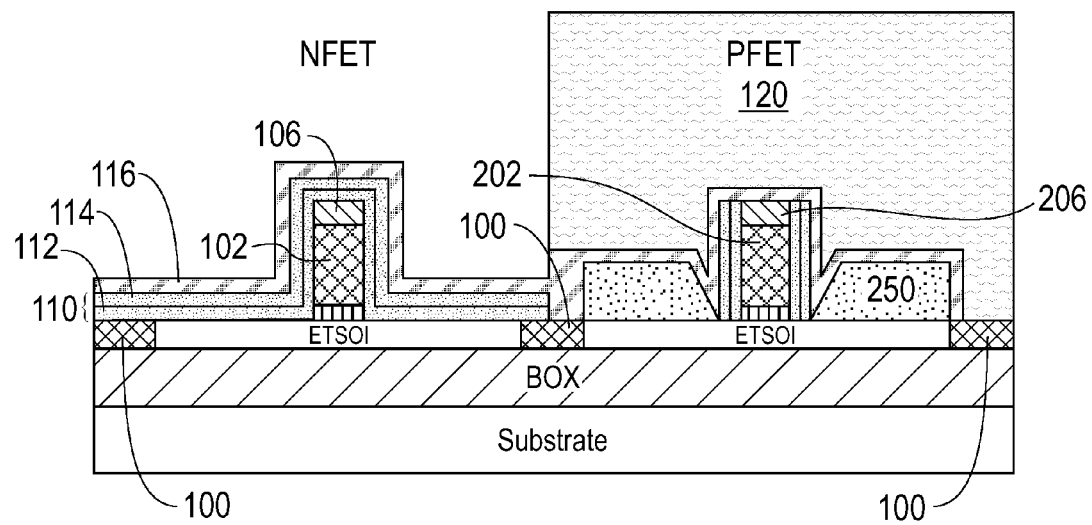
FIGS. 3A, 3B and 3C are a cross-sectional representation of the masking and etching of the CMOS structure to form the second spacer according to a first embodiment of the invention.

FIG. 3A illustrates the second insulating layer and masking of the pFET region with a mask (120). After the first RSD is grown and a second insulating layer (116) is applied to the substrate layer on the nFET and pFET regions, the mask (120) is applied to the pFET region. The second insulating layer (116) can be selected from, but not limited to, silicon nitride, hafnium oxide ($HfO_2$), zirconium oxide ($ZrO_2$), or aluminum oxide ($AlO_2$). In a preferred embodiment the second insulating film (116) is silicon nitride. In a further preference, the silicon nitride film is deposited at 630° C. by a Chemical Vapor Deposition (CVD) process. The second insulating film (116) can have a thickness from about 1 nm to about 50 nm. Preferably the second insulating layer is 20 nm.

Figure 3B:
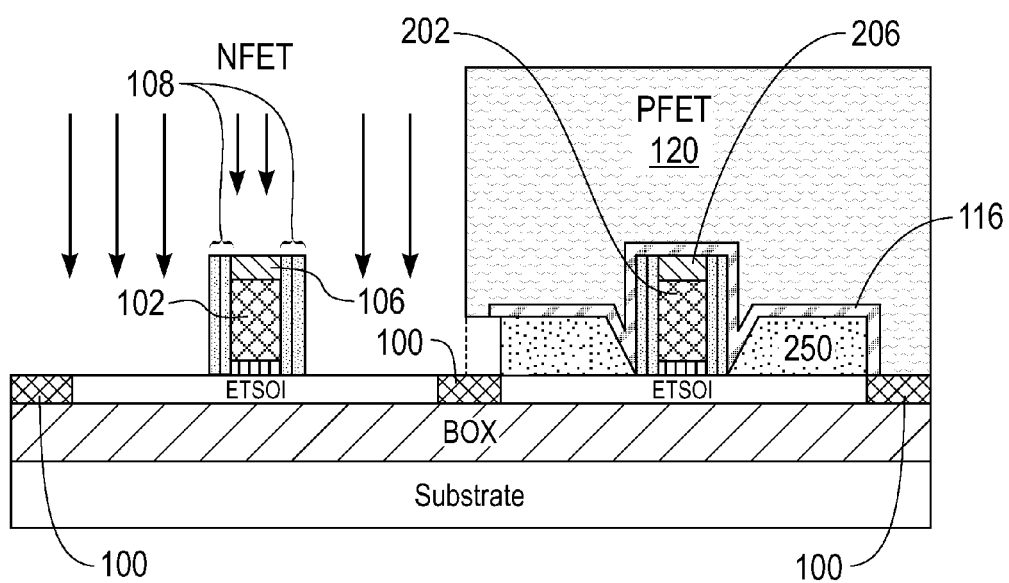

FIG. 3B shows the etching of the nFET region. The pFET is protected by a mask (120) while the second insulating layer (116) is then removed by etching from the nFET region to expose the first insulating layer (110). The first insulating layer (110) is then wet etched from the nFET portion to form insulating sidewall spacers (108) on the sidewalls of the first gate stack and expose the ETSOI surface. The nFET sidewall spacer total thickness of both the nitride layers is from about 6 nm to about 30 nm.

Figure 3C:
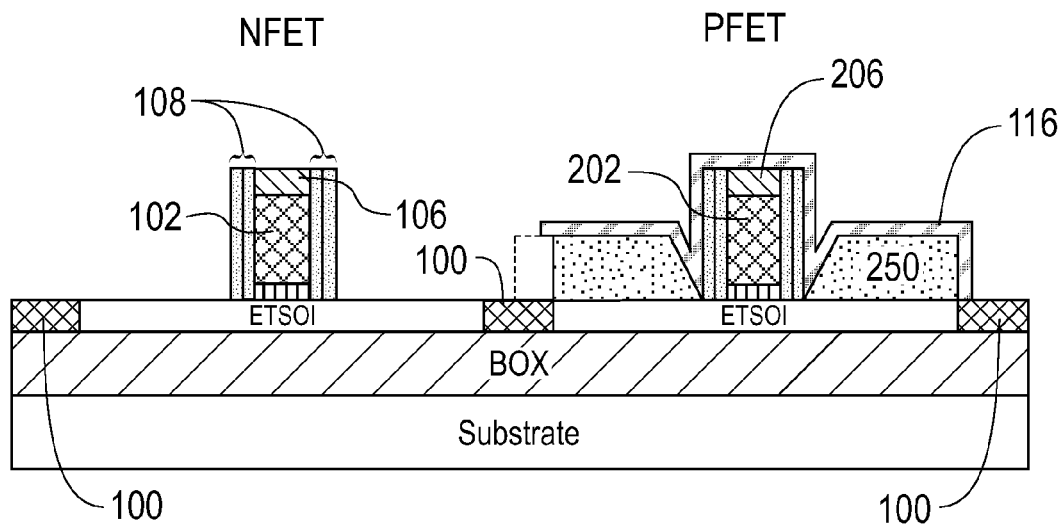
Figure 3D:
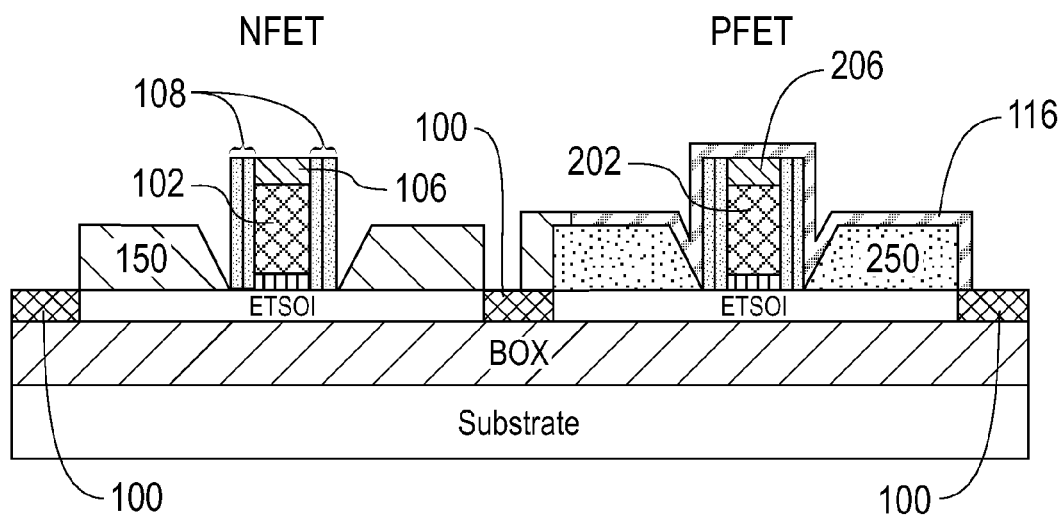
FIG. 3D is a cross-sectional representation of the dual RSD structure.

FIG. 3C shows the CMOS structure without the mask (120). The mask (120) from the pFET region is then removed by wetting the photoresist. In FIG. 3D, an undoped epitaxial RSD layer is then applied on the ETSOI surface of the nFET region to create the second RSD (150). The epitaxial RSD (150) on the nFET are then doped. The height of the raised source drain is from about 7 nm to about 60 nm and is preferably 30 nm.

Figure 3E:
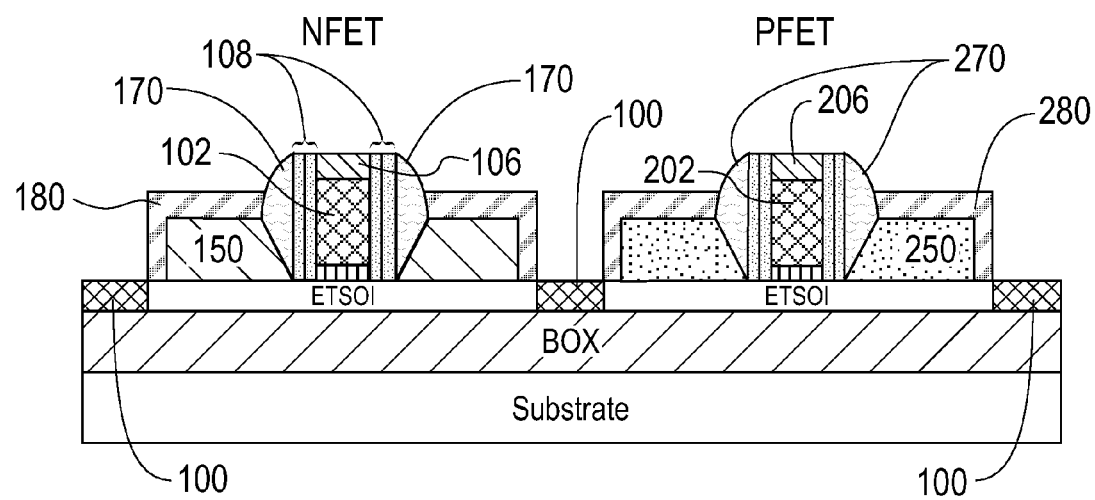
FIG. 3E is a cross-sectional representation of the dual structure with another spacer and silicide contacts.

FIG. 3E illustrates the dual RSD CMOS structure. The second insulating layer (116) in the pFET region is removed by etching. Note that the sidewall spacers (108, 208) on both gate stacks will be of equal thickness. A dopant will be applied if the pFET is undoped. A second set of spacers (170, 270) are formed on top the insulating spacers by depositing SiNi film. A highly directional dry etch process is used to remove the SiNi film from the horizontal surfaces, which leaves the second spacer. Finally, silicide contacts (180, 280) are formed on the RSD layers of the pFET and nFET. Acceptable silicide could be nickel and silicide thickness is from about 5 nm to about 55 nm, preferably 15 nm.

Forming the Second Raised Source Drain Using Oxidation

FIG. 2 illustrates the first RSD structure. The CMOS structure is formed as previously described by providing a SOI substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, and forming epitaxial source and drain layers on the second substrate surface.

Figure 4A:
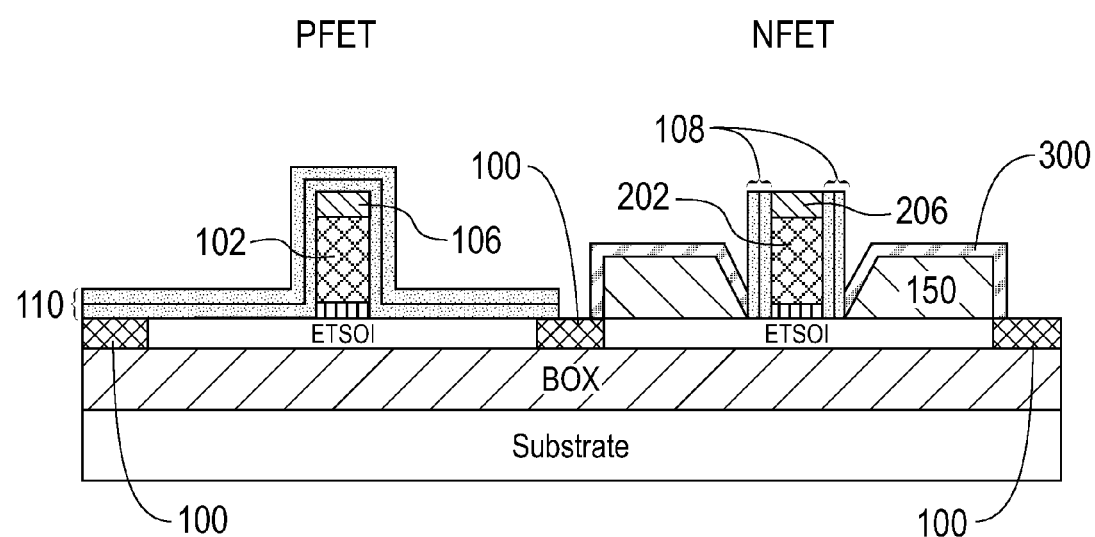
FIGS. 4A, 4B and 4C are a cross-sectional representation of the masking and etching of the CMOS structure to form the second spacer according to a second embodiment of the invention.

FIG. 4A illustrates the undoped silicon layer (300) applied to the nFET region. Instead of adding a second insulating layer, a thin layer of undoped silicon (300) on top of the first source and drain on the nFET region. The silicon is deposited by selective epitaxial CVD method. The thickness of the silicon can be from about 5 nm to about 50 nm and preferably 35 nm.

Figure 4B:
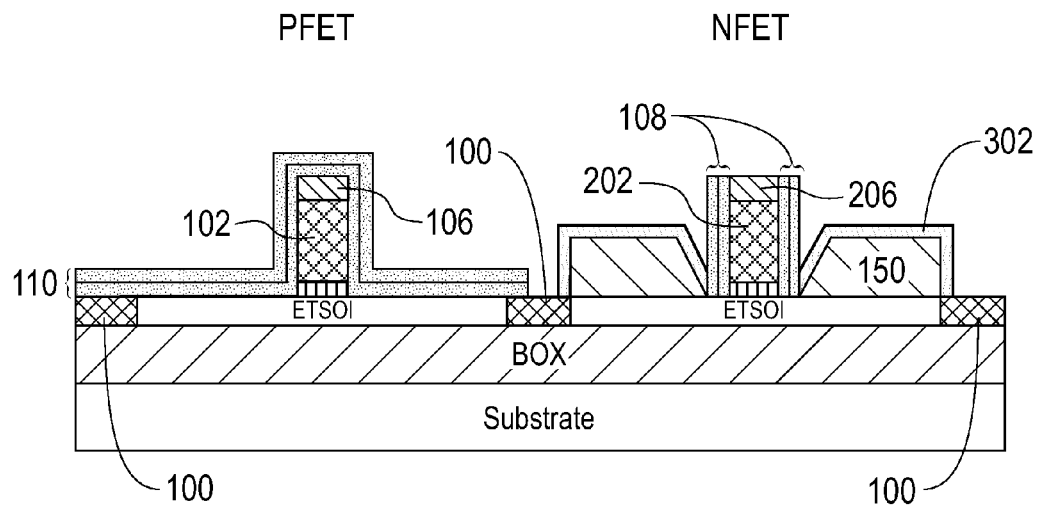

FIG. 4B illustrates the hard mask layer (302) on the nFET region. The undoped layer is then oxidized to form a hard mask layer (302). The oxidization allows for controlling the thickness of the hard mask layer (302) in a precise manner. The hard mask layer (302) acts to protect the nFET source and drain while the first insulating layer of the pFET gets etched away. No mask or strip resist is needed to cover the nFET source and drain from the etching. The thickness of the hardmask can be from about 3 nm to about 50 nm and preferably 15 nm.

Figure 4C:
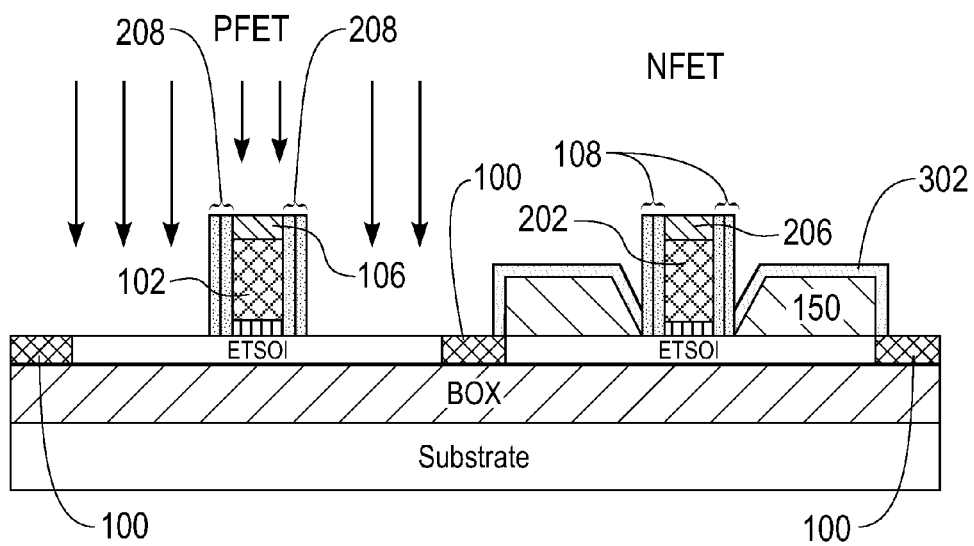
Figure 4D:
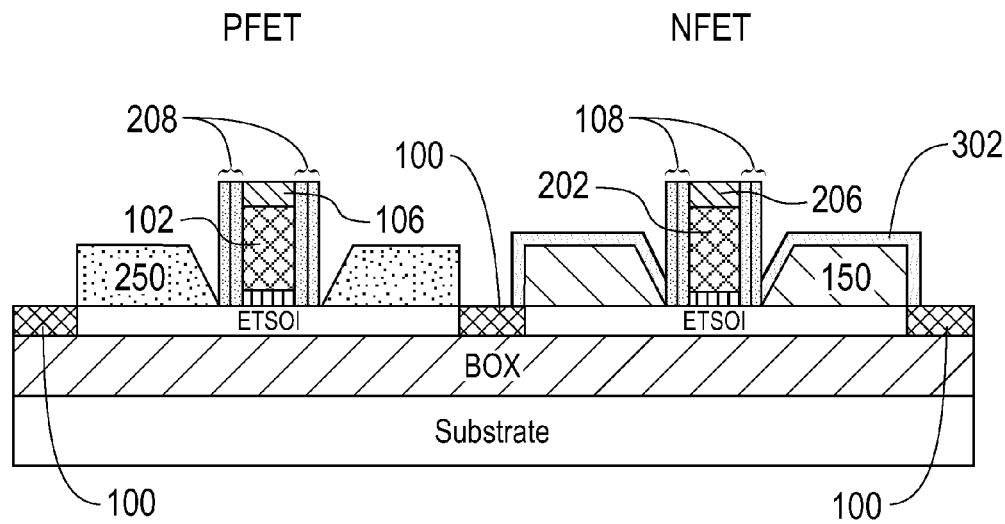
FIG. 4D is a cross-sectional representation of a RSD after epitaxy.
Figure 4E:
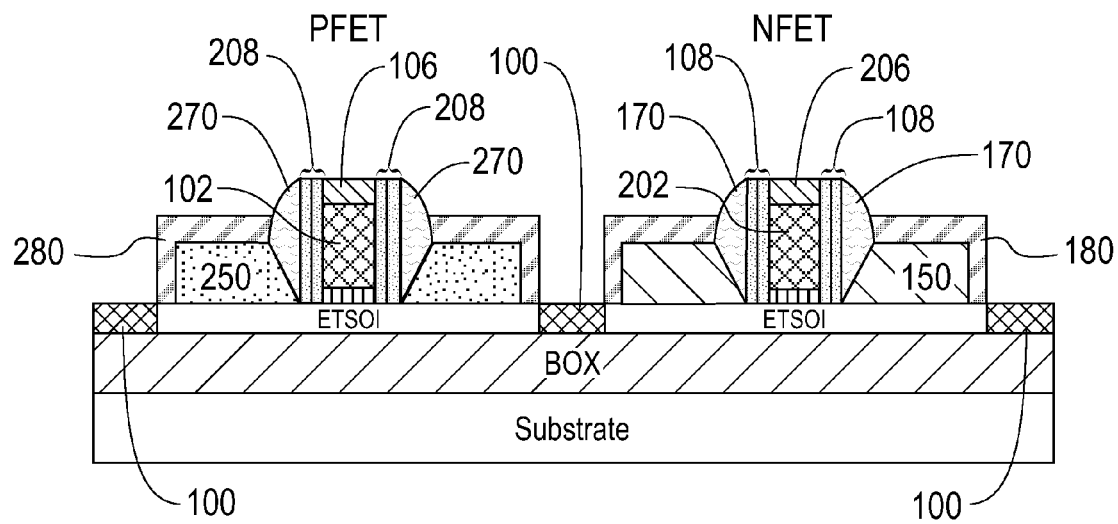
FIG. 4E is a cross-sectional representation of the dual structure with another spacer and silicide contacts.

FIG. 4C illustrates the spacer formation on the pFET region. The etching of the pFET region creates the insulating spacers on the sidewalls of the gate stack and exposes the first substrate surface. FIG. 4D illustrates the second RSD on the pFET region. The second epitaxial RSD (250) is then in-situ doped while the hard mask layer (302) is still on top of the nFET region. If the source and drain layers on nFET surface are undoped, a dopant will be implanted. FIG. 4E illustrates the final product. The hard mask layer (302) is removed by etching. Finally, silicide contacts (180, 280) and another spacer (270,270) are formed on the source and drain layers of the pFET and nFET as previously described.

Forming the Second Raised Source Drain Using an Amorphous Layer

FIG. 2 illustrates the first RSD structure. The CMOS structure is formed as previously described by providing a SOI substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, and forming epitaxial source and drain layers on the second substrate surface.

Figure 5A:
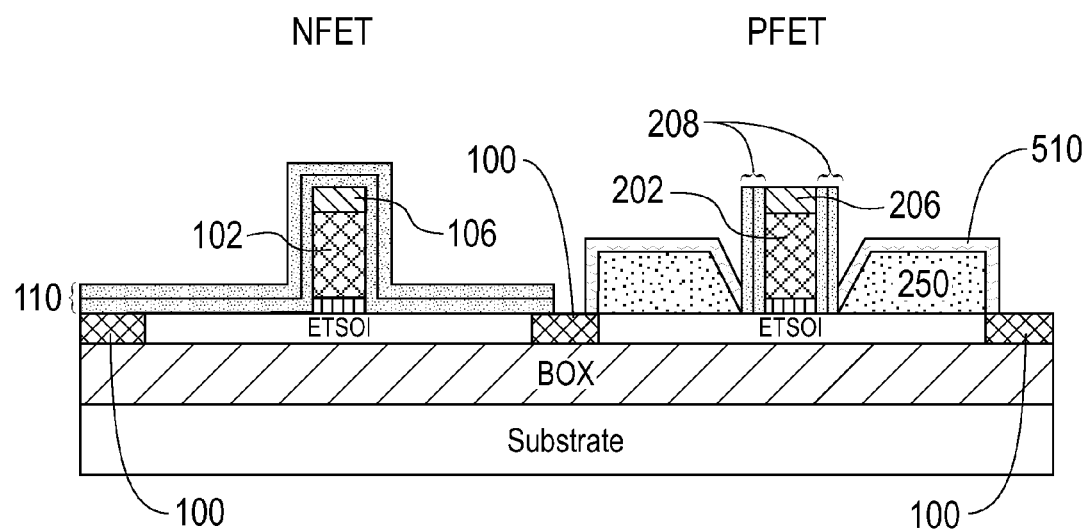
FIGS. 5A, 5B and 5C are a cross-sectional representation of the masking and etching of the CMOS structure to form the second spacer according to a third embodiment of the invention.

FIG. 5A shows the thin amorphous layer (510). The embodiment describes forming a thin amorphous layer (510) of silicon on the raised source and drain layers (250) on the pFET region. Alternatively, the amorphous layer (510) can also be formed by implanting a neutral species into the epitaxial source and drain layers to convert a top layer into the amorphous layer. The amorphous layer has a thickness from about 3 nm to about 20 nm; preferably 10 nm.

Figure 5B:
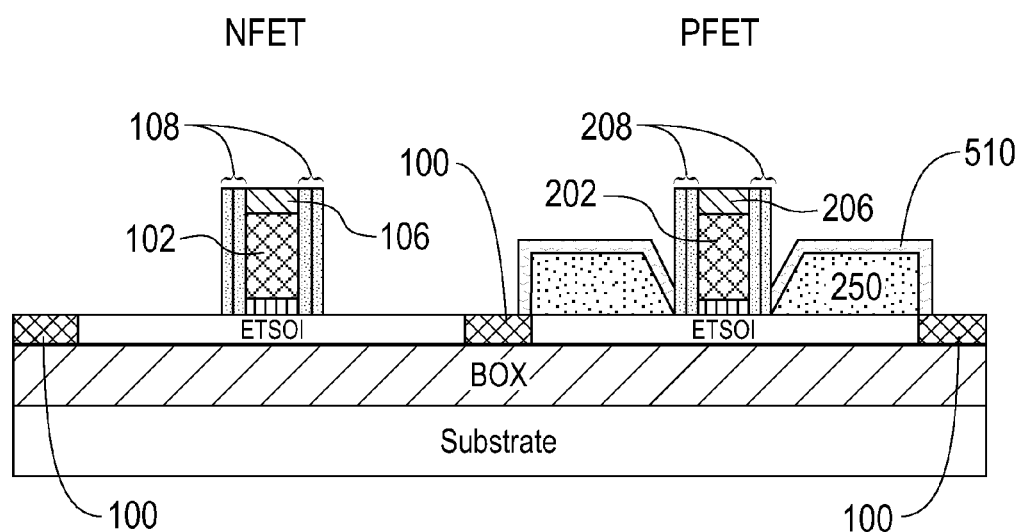

In FIG. 5B, the first insulating layer (110) is etched in the nFET region to form insulating spacers (108) on sidewalls of the nFET gate stack and to expose the first substrate surface. The etching can be done with or without masking the pFET, depending on the selectivity of the SiN to the amorphous silicon. The etch is a dry etch as is known in the art of etching SiN spacers. This is done by using a dry directional Reactive Ion Etching (RIE) process composed of $CF_8$, or $CH_2F_2$ or other chemistry as is known to etch silicon nitride selective to silicon.

Figure 5C:
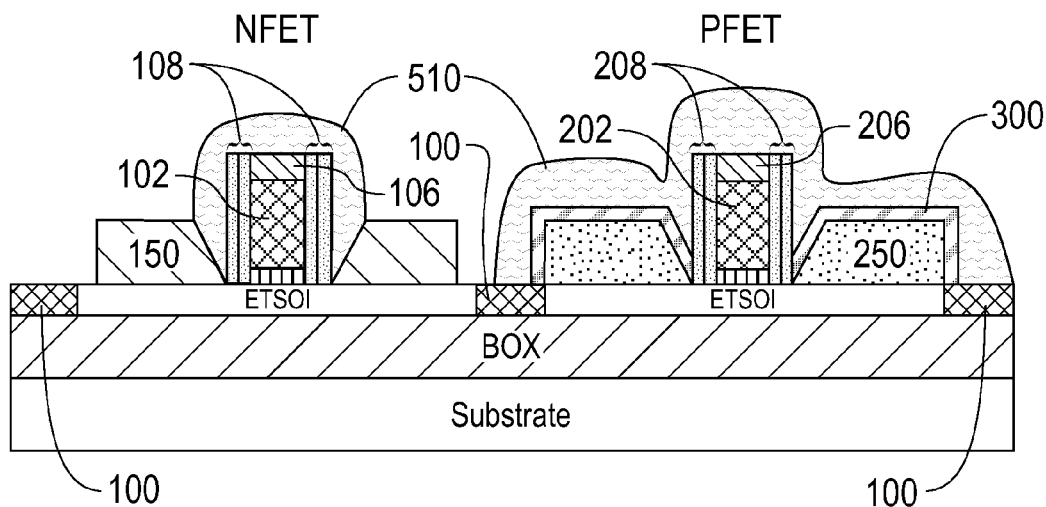
Figure 5D:
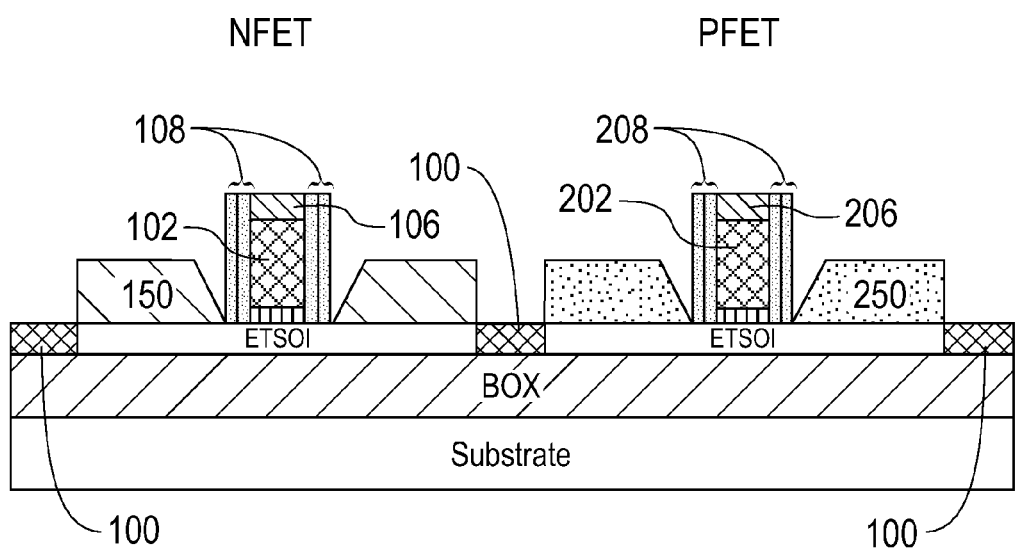
FIG. 5D is a cross-sectional representation of a RSD after epitaxy.

FIG. 5C shows the formation of the RSD (150) on the nFET region. The doped epitaxial RSD layers (150) are formed in-situ on the nFET region. The height of the raised source drains is as previously described. In FIG. 5D, the thin amorphous layer over the pFET and any amorphous material that formed during the formation of the in-situ doped epitaxial RSD layers (150, 250) are then removed by wet etching. Alternatively, instead of having to do a separate raised source and drain growth and then raised source and drain etching, the doped epitaxial source and drain layers can be formed by simultaneously growing the epitaxial film and in-situ etching any amorphous silicon carbide. The insitu doped silicon carbide growth on the amorphous layer may be etched during the deposition process by using a dep etch process which is known in the art of building semiconductor circuits. The etch portion of the dep etch process utilizes HCl gas to preferentially remove silicon containing materials that are not single crystal, which is the case for silicon containing materials growing on amorphous silicon. Finally, silicide contacts are formed on the source and drain layers of the pFET and nFET.

Forming the Second Raised Source Drain Using a Hard Mask

FIG. 2 illustrates the first RSD structure. The CMOS structure is formed as previously described by providing a silicon-on-insulator substrate having a first substrate surface in a first region and a second substrate surface in a second region, wherein the first substrate surface and the second substrate surface are isolated by a shallow trench isolation, forming a first gate stack on the first substrate surface and a second gate stack on the second substrate surface, forming a first insulating layer on all exposed surfaces in the first and second regions, etching the first insulating layer in the second region to form insulating spacers on sidewalls of the second gate stack, and forming epitaxial source and drain layers on the second substrate surface.

Figure 6A:
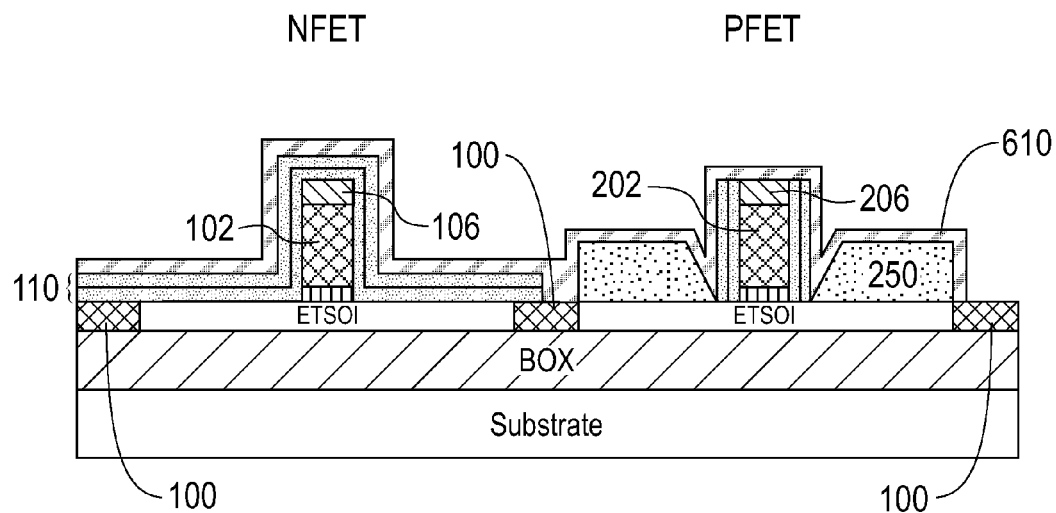
FIGS. 6A, 6B and 6C are a cross-sectional representation of the masking and etching of the CMOS structure to form the second spacer according to a fourth embodiment of the invention.
Figure 6B:
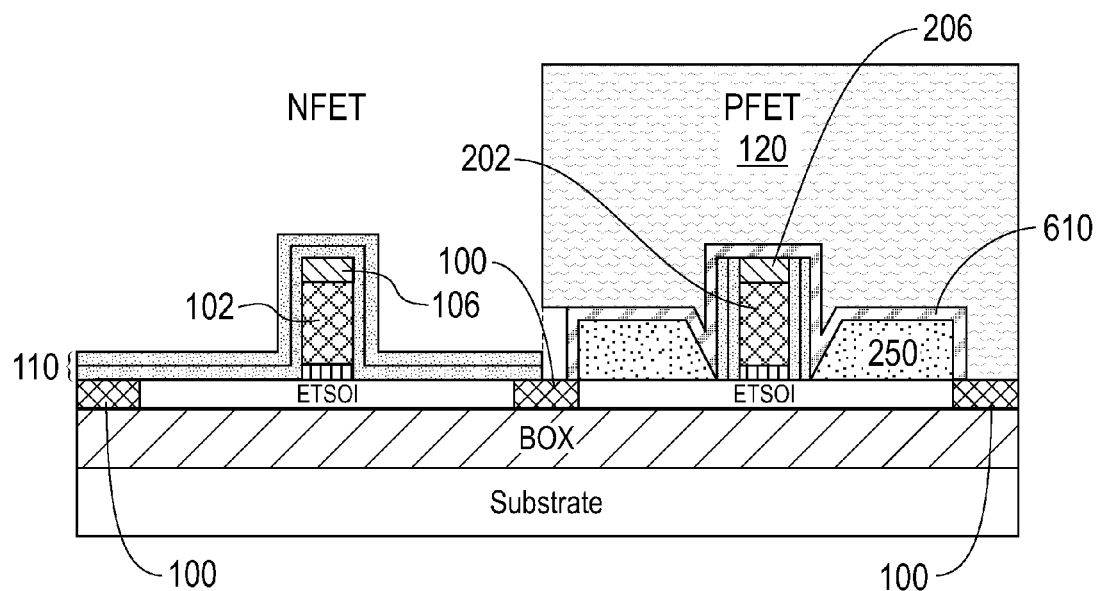

In FIG. 6A, the embodiment describes forming a hard mask layer (610) on all exposed surfaces in the first and second regions. The hard mask layer (610) can be made of, but not limited to, Hafnium Oxide ($HfO_2$), Zirconium Oxide ($ZrO_2$), Aluminum Oxide ($AlO_2$), Silicon Nitride (SiN), or an Hydrogen-rich SiN. The thickness of the hardmask is from about 3 nm to about 25 nm, preferably 12 nm. The hard mask layer (610) in the nFET region is removed using a wet etch while the pFET region has a resist, protecting it from the wet etch as shown in FIG. 6B. In the nFET region, the first insulating layer (110) is now exposed after etching.

Figure 6C:
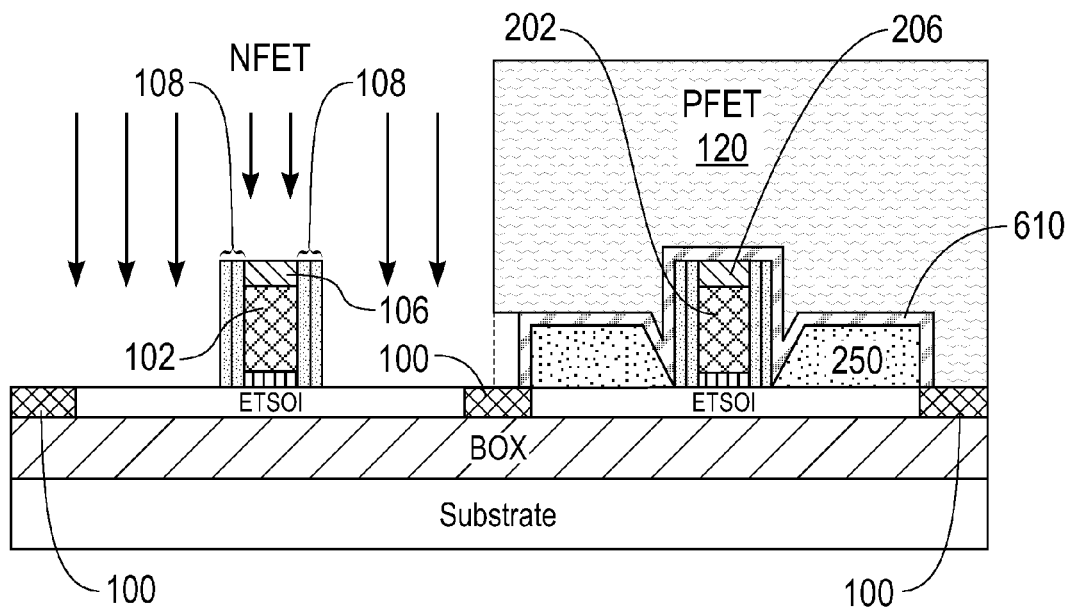

FIG. 6C illustrates the exposed substrate layer. The first insulating layer (110) is then etched to (i) form sidewall spacers (108) on the sidewalls of the nFET gate stack (102) and (ii) expose the ETSOI surface. The epitaxial RSD (150) layers are then grown on the ETSOI of the nFET region as previously described. The resist is then stripped off and the hard mask in the pFET region is then annealed at 700 C for 2 minutes if the hardmask material is composed of Hafnium Oxide ($HfO_2$), Zirconium Oxide ($ZrO_2$), Aluminum Oxide ($AlO_2$) and 500 C for 2 minutes if the hardmask material is composed of SiN.

Figure 6D:
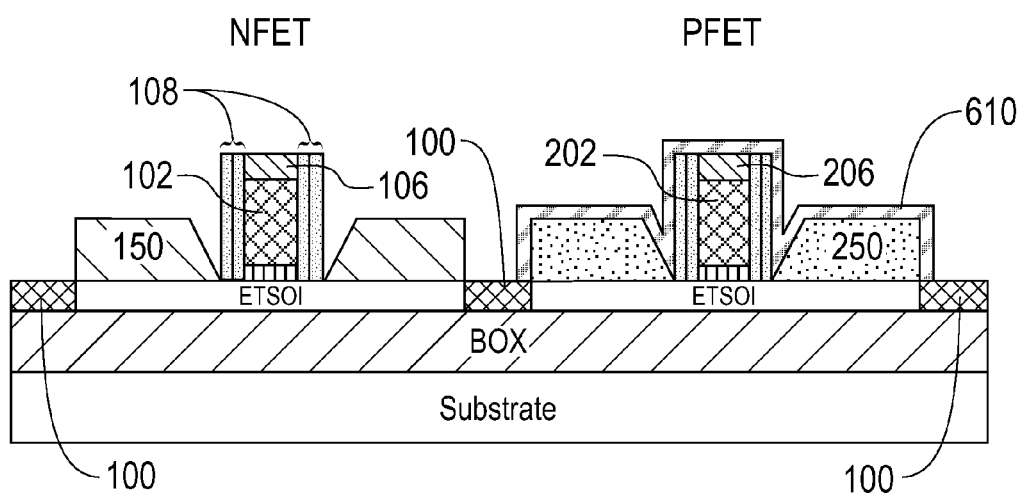
FIG. 6D is a cross-sectional representation of a RSD after epitaxy.

FIG. 6D illustrates the dual raised source drain structure. To finalize the structure, the hard mask layer (120) in the pFET region is removed and the silicide contacts on the source and drain layers are formed in both the first and second regions and on the first and second gate stacks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a CMOS structure, the method comprising:
    providing a silicon-on-insulator substrate having a first substrate surface in a first region and a second substrate surface in a second region, wherein the first substrate surface and the second substrate surface are isolated by a shallow trench isolation;
    forming a first gate stack on the first substrate surface and a second gate stack on the second substrate surface;
    forming a first insulating layer on all exposed surfaces in the first and second regions;
    etching the first insulating layer in the second region to form insulating spacers on sidewalls of the second gate stack;
    forming raised epitaxial source and drain layers on the second substrate surface;
    forming a layer of undoped epitaxial silicon on the raised epitaxial source and drain layers on the second substrate surface;
    oxidizing a top surface of the layer of undoped epitaxial silicon to form a hard mask layer;
    etching the first insulating layer in the first region to form insulating spacers on sidewalls of the first gate stack and to expose the first substrate surface;
    forming in-situ doped epitaxial source and drain layers on the first substrate surface;
    removing the oxidized layer of undoped epitaxial silicon from the raised epitaxial source and drain layers on the second substrate surface;
    if the source and drain layers on the second substrate surface are undoped, implanting a dopant into the source and drain layers on the second substrate surface; and
    with the insulating spacers still remaining on the sidewalls of the first and second gate stacks, forming silicide contacts on the source and drain layers in both the first and second regions and on the first and second gate stacks.

2. The method of claim 1, wherein etching the first insulating layer in the first region is performed without the use of a lithographically patterned mask.

3. The method of claim 1, wherein the layer of undoped epitaxial silicon has a thickness of about 5 nanometers (nm) to about 50 nm.

4. The method of claim 3, wherein the hard mask layer that results from the oxidation of the layer of undoped epitaxial silicon has a thickness of about 3 nm to about 50 nm.

5. The method of claim 4, wherein the layer of undoped epitaxial silicon has a thickness of about 35 nm, and the hard mask layer that results from the oxidation of the layer of undoped epitaxial silicon has a thickness of about 15 nm.

6. The method of claim 1, further comprising forming a second set of spacers between the raised source and drain layers and the insulating spacers on the sidewalls of the first and second gate stacks.

* * * * *